United States Patent
Costa et al.

[19]

[11] Patent Number: 6,005,502
[45] Date of Patent: Dec. 21, 1999

[54] METHOD FOR REDUCING THE NUMBER OF BITS NEEDED FOR THE REPRESENTATION OF CONSTANT VALUES IN A DATA PROCESSING DEVICE

[75] Inventors: Raffaele Costa; Davide Santinoli, both of Milan, Italy

[73] Assignee: SGS Thompson Microelectronics S.r.l., Agrate Brianza, Italy

[21] Appl. No.: 08/966,906

[22] Filed: Nov. 7, 1997

[51] Int. Cl.[6] .................................................. H03M 7/40
[52] U.S. Cl. .................................. 341/65; 341/50; 341/67
[58] Field of Search .................................. 341/50, 65, 67

[56] References Cited

U.S. PATENT DOCUMENTS

| | | | |
|---|---|---|---|
| 4,192,010 | 3/1980 | Kerner et al. | 364/900 |
| 5,329,313 | 7/1994 | Keith | 348/422 |
| 5,481,364 | 1/1996 | Ito | 358/261.1 |
| 5,648,774 | 7/1997 | Hsieh | 341/67 |
| 5,751,233 | 5/1998 | Tateno et al. | 341/67 |
| 5,801,840 | 9/1998 | Sakai | 358/427 |
| 5,801,975 | 9/1998 | Thayer et al. | 364/725.03 |

FOREIGN PATENT DOCUMENTS 0 489 266 A3  6/1992  European Pat. Off. .

OTHER PUBLICATIONS

"Harvard architecture pushes microcontroller IC into high-speed realm," *Electronic Design*, vol. 33, No. 2, Jan. 1985, pp. 127–136.

"Padding a Microcode Control Word," *IBM Technical Disclosure Bulletin*, vol. 30, No. 5, Oct. 1987, pp. 79–80.

*Primary Examiner*—Michael Tokar
*Assistant Examiner*—Anh Q Tran
*Attorney, Agent, or Firm*—Jenkens & Gilchrist, P.C.

[57] ABSTRACT

A method for reducing the number of bits needed to represent constant values in a data processing device. A group of constant values is defined by selecting them as a function of their statistical frequency of use. Each constant value of this group in the instructions is represented by means of a shorter coded operand field and a current instruction is loaded from a bus in an instruction register. A corresponding operand field is derived from the coded operand field of the current instruction by expansion means, and a bus and an output of the expansion means are selectively connected as input to an arithmetic logic unit.

23 Claims, 2 Drawing Sheets

2

METHOD FOR REDUCING THE NUMBER OF BITS NEEDED FOR THE REPRESENTATION OF CONSTANT VALUES IN A DATA PROCESSING DEVICE

FIELD OF THE INVENTION

The present invention relates to a method and device for reducing the number of bits needed for the representation of constant values in a data processing device.

BACKGROUND OF THE INVENTION

A data processing device, for example, a microprocessor, is constituted by an assembly of digital electronic circuits (hardware) for executing instructions stored in a suitable program (software). A typical instruction comprises a sequence of binary digits (bits) and includes a part which indicates the type of operation to be executed (operation code), and a part which enables the data to be operated on (the operand field) to be identified. A data processing device generally utilizes various addressing modes to access this data. In particular, in immediate addressing, the data is specified by referring directly to its value in the instruction (immediate operand). This method of addressing is particularly useful when constant values are to be used. In the immediate addressing method, therefore, N bits of the operand field are needed to represent $2^N$ different constant values.

Various solutions are known for reducing the number of bits necessary for representing constant values in instructions intended to contain data to be addressed immediately. In so-called short constant systems, only Q bits (where Q<N) of lesser significance of the constant are represented in the operand field, obtaining the bits of greater significance thereof by sign extension or zero filling. In particular, in the case of sign extension, all the bits of the constant from the position Q+1 to the position N−1 are given the same value as the sign bit in position Q, while in the case of zero filling, these bits of the constant are given the value 0. The values which can be represented lie, respectively, in the range $-2^{Q-1}$ to $2^{Q-1}-1$, and the range 0 to $2^Q-1$. In single bit systems, the constants having a single bit with a value of 1 are represented by indicating the position of this bit in the constant. In this case, a number of bits P is necessary, given by the relationship $N=2^P$, that is, $P=\log_2 N$. This system is usually used for instructions at the single bit level for clear, set, test, and toggle operations.

A disadvantage of the known systems is that only certain types of constants can be represented shortened. These systems therefore impose severe limitations both on the value of the representable constants and on their structure.

In addition, the set of reduced length constants represented in the known systems is fixed and is independent of the different operative requirements of the data processing device.

What is needed is a method and device for overcoming the aforesaid disadvantages.

SUMMARY OF THE INVENTION AND ADVANTAGES

Accordingly, the present invention provides a method for reducing the number of bits necessary to represent constant values for use in a data processing device for executing instructions including an operand field which represents a constant value. The method comprises the steps of defining a group of constant values by selecting them as a function of their statistical frequency of use, representing each constant value of the group in the instructions by a coded operand field having fewer bits than the operand field, and at least partially loading a current instruction into an instructions register from a bus. The method further includes the step of deriving a corresponding operand field from the coded operand field of the current instruction using expansion means if the current instruction contains a coded operand field and selectively connecting the bus and an output of the expansion means as input to an arithmetic-logic unit.

The present invention also provides a data processing device for executing instructions including an operand field which represents a constant value wherein each constant value of a group of constant values chosen as a function of their statistical frequency of use being represented in the instructions by a coded operand field with fewer bits than the operand field. The data processing device comprises an instruction register for at least partially loading a current instruction from a bus, expansion means for deriving a corresponding operand field from the coded operand field of the current instruction, and a multiplexer for selectively connecting the bus and an output of the expansion means as input to an arithmetic-logic unit.

One advantage of the present invention is that it enables different types and structures of constant to be represented as a function of the requirements of a wide variety of applications.

Another advantage of the present invention is that the representation of the constants depends on the use envisioned for the data processing device; this enables the device to be adapted to the applications in which it is used, consequently improving their performance in each individual operating condition.

BRIEF DESCRIPTION OF THE DRAWINGS

Further characteristics and advantages of the method of the present invention will become clearer from the following description of a preferred embodiment, given by way of non-limitative example, with reference to the accompanying drawings, in which.

DETAILED DESCRIPTION OF A PREFERRED EMBODIMENT OF THE INVENTION

Figure 1:
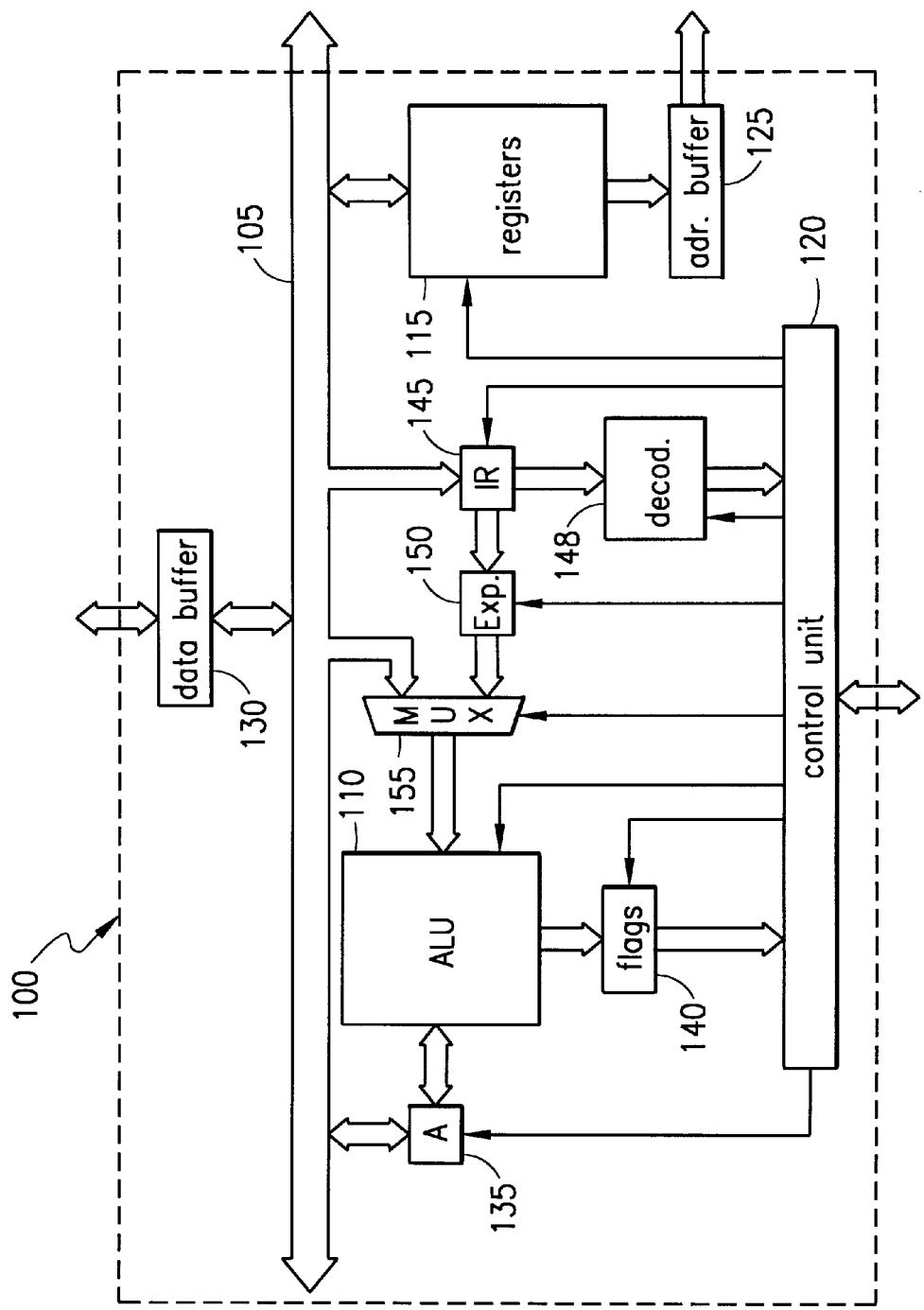
FIG. 1 is a data processing device which may be used to perform the method of the present invention.

With reference now to the drawings, and with particular reference to FIG. 1, a data processing device 100, specifically a microprocessor ($\mu$P), is shown. However, the present invention also lends itself to being put into practice utilizing different data processing devices such as, for example, a logic controller. As usual, wide arrows indicate the passage of words, while small arrows indicate the passage of single bit commands. The data processing device 100 includes an internal data bus 105 to which is connected an arithmetic-logic unit (ALU) 110 which is able to execute calculations and checks. A plurality of internal registers 115 such as general purpose registers, a program counter, an instructions address register, a stack pointer and the like, are also connected to the bus 105. The data processing device also includes a control unit 120 which controls the different functions of the various components and their access to the internal data bus 105 by means of suitable pulses. An address buffer 125 connected to the internal registers 115, and a data buffer 130 connected to the internal data bus 105, are connected respectively to an external address bus and an external data bus (not shown in the drawings). The control unit 120 is connected directly to an external control bus (not shown in the drawings). An accumulator register (A) 135, for storing an operand and the result of the various operations performed by the ALU 110, is connected to the internal data bus 105 and the ALU 110. A state register 140, the bits (flags) of which are used as indicators of particular operating conditions, is connected to the ALU 110 and the control unit 120. An instruction register (IR) 145 is used to receive a current instruction to be executed, or at least a portion thereof comprising its operation code, from the internal data bus 105. This operation code is sent to an instruction decoder unit 148, as a function of the output from which the control unit 120 activates the various circuit elements to execute the current instruction.

Some of the instructions utilized in the data processing device 100 include a constant value which must be inputted to the arithmetic-logic unit 110 in the form of an N bit operand field $C_{N-1} \ldots C_1 C_0$. In the method of the present invention, a group of constant values having a high statistical frequency of use is determined in advance. This determination is made, for example, from an analysis of the type of applications envisioned for the data processing device, or by utilizing appropriate benchmark programs. The above-determined group of constant values is coded appropriately such that each constant is represented in the instructions by a coded operand field having fewer than N bits.

The method of the present invention lends itself to being put into practice using various systems for coding these constant values. In a first embodiment, constants having N bits are represented by a coded operand field of $2+\log_2 N$ bits in the form $a_1 a_0 b_{L-1} \ldots b_1 b_0$. The bits $b_{L-1} \ldots b_1 b_0$ (with $L=\log_2 N$) comprise a position field and identify a bit position B (from 0 to N-1) in the operand field. The bits $a_1 a_0$, which may take four different values (00, 01, 10 and 11), form a selector which defines the structure of the operand field. For example, the selector $a_1 a_0$ indicates which bits of the operand field have the value 1, in particular:
00: only the bit in position B;
01: all of the bits except for the bit in position B;
10: all of the bits from the first position (0) to position B;
11: all of the bits from position B+1 to the last position (N-1)

In other words, the operand field is obtained from a string of N bits of value 0 by giving the bit in position B the value 1 when $a_1=0$, or by giving all of the bits from position 0 to position B the value 1 when $a_1=1$. When $a_0=0$ the value thus obtained is left unchanged, while when $a_0=1$ this value is bit-wise inverted. This coding system is utilized advantageously for constants having a single bit of value 1 or 0, for constants of value 0(00000000), ±1 (00000001, 11111110), ±2 (00000010, 11111101), ±3 (00000011, 11111100), ±4 (00000100, 11111011), ±8 (00001000, 11110111) and so on, used for loading, comparisons, rapid additions and subtractions (the constant −1 is also used as a mask in a toggle bit command to replace the one's complement operation), and also for constants of the type 11 . . . 100 . . . 0 and 00 . . . 0.11 . . . 1 used for sign or zero extension, and for the insertion or extraction of bit fields in a word.

In an alternative embodiment of the present invention, constants having N bits are represented by an operand field coded as $3+\log_2 N$ bits in the form $s_0 a_1 a_0 b_{L-1} \ldots b_1 b_0$, in which the bit $s_0$ comprises a selector bit which defines which bit of the operand field is considered as the last bit in the decoding process described above. When $s_0=0$, position N−1 is considered to be the last position of the operand field while when $s_0=1$, position N/2−1 is considered to be the last position of the operand field; in the latter case, the bit position B (from 0 to N/2−1) is represented in the coded operand field only by the bits $b_{L-2} \ldots b_1 b_0$, while the bit $b_{L-1}$ represents the value to be attributed to the bits of the operand field in the position N/2 to the position N−1. Several examples of constants having 16 bits coded according to the coding system described above with $3+\log_2 16=3+4=7$ bits are given below:

| $s_0$ | $a_1 a_0$ | $b_3 b_2 b_1 b_0$ | operand field |
|---|---|---|---|
| 0 | 1 1 | 0 1 1 1 | 1111111100000000 |
| 0 | 0 0 | 0 0 0 1 | 0000000000000010 |
| 1 | 1 1 | 0 1 0 1 | 0000000011000000 |
| 1 | 1 0 | 1 0 1 0 | 1111111100000111 |

This coding system allows constants having two non-contiguous blocks of bits of value 1 (or 0) to be represented. This is particularly advantageous in reduced instruction set computers, or RISC, which are only able to operate on the full range of their registers. In this case, the system described above enables operations to be performed on data which is shorter than a register.

Returning to FIG. 1, the data processing device 100 includes an expansion unit 150 which receives a coded operand field from the instruction register 145 as input, and produces the corresponding operand field as output. The output of the expansion unit 150 is connected to a first input of a multiplexer circuit 155, the second input of which is connected to the internal data bus 105. The multiplexer 155 transfers one of its two inputs to its output connected to the ALU 110 in dependence on an appropriate control signal applied to a selector input. In particular, a portion (address field) of the operation code of every instruction contains an indication of the kind of address utilized thereby (for example, immediate, direct, indirect, relative, from the register, indexed and the like). In the case of immediate addressing, an appropriate bit of this field enables immediate addressing without coding to be distinguished from coded immediate addressing. In the case of immediate addressing without coding, the control unit 120 sends a signal for reading the immediate operand from the bus 105 and therefore causes the multiplexer 155 to transfer the data on the bus 105 to the ALU 110. In the case of coded immediate addressing, the control unit 120 enables the expansion unit 150 and, at the same time, commands the multiplexer 155 to transfer the output thereof to the ALU 110. This data processing device therefore enables the use of shorter instructions which require fewer memory access steps (machine cycles) to fetch them. This, in turn, reduces the memory space occupied by the programs and increases their speed of execution.

Figure 2:
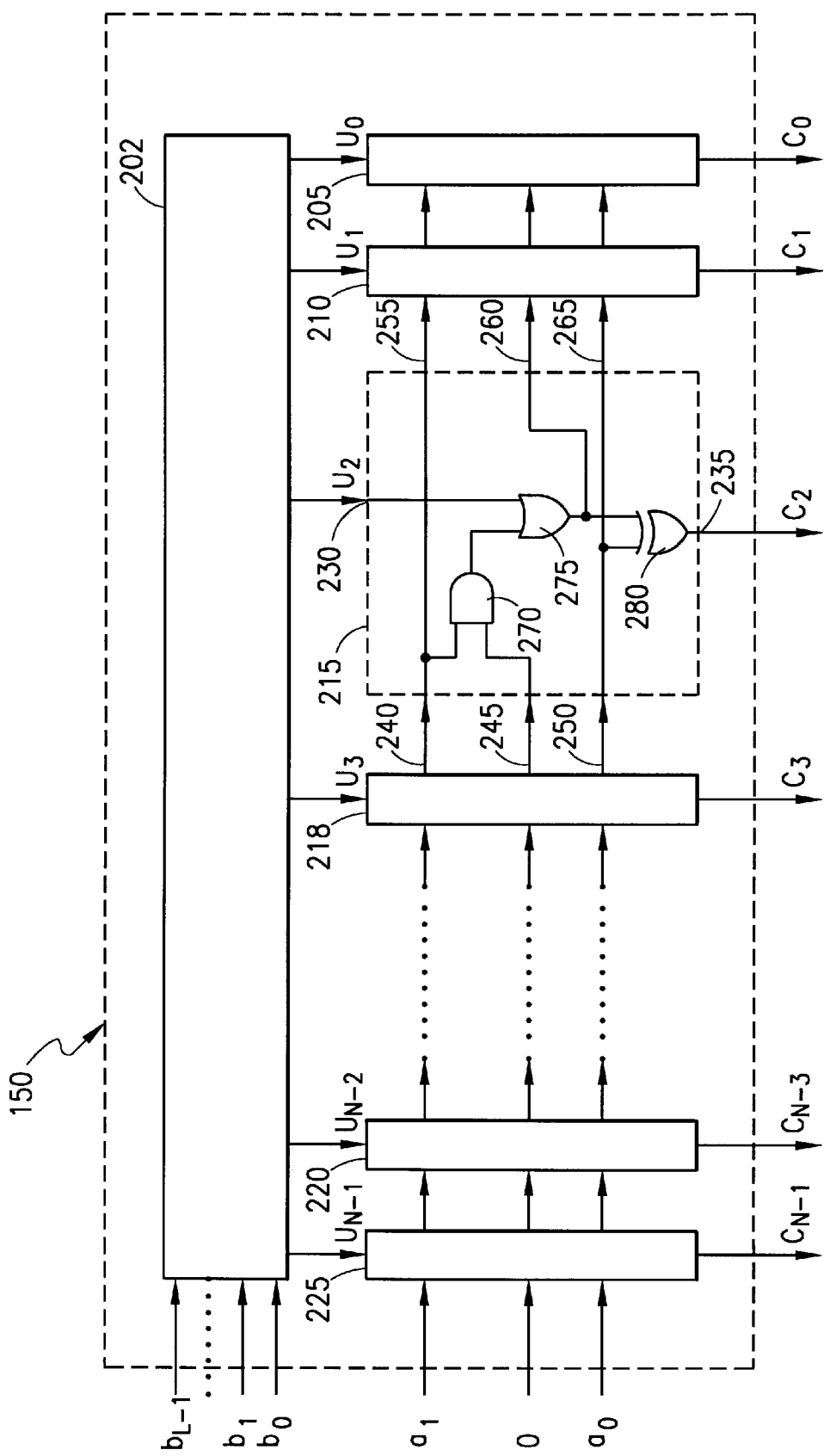
FIG. 2 is an embodiment of the expansion unit of FIG. 1.

With reference now to FIG. 2, an embodiment of the expansion unit 150 is illustrated which may be used in combination with a coding system in the form $a_1 a_0 b_{L-1} \ldots b_1 b_0$ described above. The expansion unit 150 receives the coded operand field $a_1 a_0 b_{L-1} \ldots b_1 b_0$ as input, and produces the corresponding operand field $c_{N-1} \ldots c_1 c_0$ as output. The expansion unit 150 includes a decoder 202 having L input terminals (for receiving the position field $b_{L-1} \ldots b_1 b_0$ as input) and N output terminals $u_{N-1} \ldots u_1 u_0$ in which, for every input combination, there corresponds a single output $u_B$ of value 1 associated with the position B identified by the position field $b_{L-1} \ldots b_1 b_0$. A corresponding combinatorial network 205–225 is associated with each of the outputs $u_{N-1} \ldots u_1 u_0$ of the decoder 202. The structure of these combinatorial networks is illustrated in detail with reference to the block 215 (similar considerations apply to the other combinatorial networks). The combinatorial network 215 includes an input terminal connected to a corresponding output terminal $u_2$ of the decoder 202, and an output terminal 235 which provides a corresponding bit $c_2$ of the operand field. The combinatorial network 215 includes three further input terminals 240–250 connected to three corresponding output terminals of the preceding combinatorial network 218, and three further output terminals 255–265 connected to three corresponding input terminals of the following combinatorial network 210. The output terminals of the last combinatorial network 205 are not used, while the input terminals of the first combinatorial network 225 receive, respectively, the value $a_1$, the fixed value 0 (typically connecting this input terminal to a reference, or earth, terminal), and the value $a_0$. The terminals 240 and 250 are connected directly to the terminals 255 and 265 respectively. The terminals 240 and 245 are connected to the input terminals of an AND gate 270; the terminal 230 and the output terminal of the AND gate 270 are connected to the input terminals of an OR gate 275. The output terminal of the OR gate is connected to the terminal 260. The terminal 250 and the same output terminal of the OR gate 275 are connected to the input terminals of an XOR gate 280. The output terminal of the XOR gate 280 is connected to the terminal 235.

In order to describe the operation of the expansion unit 150, the position field $b_{L-1} \ldots b_1 b_0$ is assumed to have the value 2, so that all of the outputs $u_{N-1} \ldots u_1 u_0$ of the decoder 202 take the value 0 apart from the output $u_2=1$. If the bit $a_1$, has the value 0, all of the AND gates 270 will have an input of value 0, and their outputs will therefore always be 0. The outputs of the OR gates 275 will therefore be equal to the input values $u_{N-1} \ldots u_1 u_0$ that is, all having the value 0 with the exception of that corresponding to the output $u_2$, which has the value 1. If the bit $a_1$, has the value 1, the AND gate of the first combinatorial network 225, having an input of value 0, will have an output of value 0. The output of the OR gate of the same combinatorial network 225 (connected to the input of the AND gate of the second combinatorial network 220) will therefore be equal to the input value $u_{N-1}$, that is, 0. Continuing analogously, it is understood that the AND gates 270 up to the one corresponding to the output $u_2$ (inclusive) have an input of value 0, so that its output will always be 0. The output of the corresponding OR gates 275 will therefore be equal to the input value $u_{N-1} u_{N-2} \ldots u_2$, that is, 0 for the inputs $u_{N-1} u_{N2} \ldots u_3$, and 1 for the input $u_2$ Instead, both of the inputs of the AND gates following that corresponding to the output $u_2$ have a value 1, so that their output will always be equal to 1; the output of the corresponding OR gates will therefore always be equal to 1. Considering now the bit $a_0$, it may be observed that when the bit $a_0$ has a value of 0, the output of the XOR gates 280 (which represents a corresponding bit of the operand field $c_{N-1} \ldots c_1 c_0$) is equal to that of the corresponding OR gates 275. When the bit $a_0$ has a value of 1, the output of the XOR gates 280 is, instead, the opposite of that of the corresponding OR gates 275.

While the invention has been particularly shown and described with reference to specific embodiments thereof, it will be understood by those skilled in the art that various changes in form and detail may be made thereto, and that other embodiments of the present invention beyond embodiments specifically described herein may be made or practice without departing from the spirit and scope of the present invention as limited solely by the appended claims.

What is claimed is:

1. A method for reducing the number of bits necessary to represent constant values for use in a data processing device for executing instructions, at least one instruction including an operand field which represents a constant value, the method comprising the steps of:
    defining a group of constant values based upon the statistical frequency of use thereof;
    representing each constant value of the group in the instructions by a coded operand field having fewer bits than the operand field;
    at least partially loading an instruction into a register from a bus;
    determining whether the instruction contains a coded operand field or an uncoded operand field;
    deriving a corresponding operand field having the constant value from the coded operand field of the instruction; and
    directing the derived operand field as an input to an arithmetic-logic unit upon an affirmative determination that the instruction contains a coded operand field.

2. A method according to claim 1, wherein the step of directing is executed as a function of the value of an address field of the instruction.

3. A method according to claim 1, wherein the operand field includes N bits, and the coded operand field includes a position field of $L=\log_2 N$ bits indicative of a bit position B in the operand field, and a selector field, and wherein the step of deriving the operand field from the coded operand field comprises the steps of:
    setting the bit in position B of the operand field to a first binary value based upon a first value being in the selector field;
    setting all the bits with the exception of the bit in position B to the first binary value based upon a second value being in the selector field;
    setting all the bits from a first position to the position B−1 to the first binary value based upon a third value being in the selector field; and
    setting all of the bits from the bit position B+1 to a final bit position to the first binary value based upon a fourth value being in the selector field.

4. A method according to claim 1, wherein the operand field includes N bits, and the coded operand field includes a position field of $L=\log_2 N$ bits indicative of a bit position B in the operand field, and a selector field, and wherein the step of deriving the operand field from the coded operand field comprises the steps of:
    setting the bit in position B of the operand field to a first binary value based upon a first value being in the selector field;
    setting all the bits with the exception of the bit in position B to the first binary value based upon a second value being in the selector field;
    setting all the bits from a first position to the position B−1 to the first binary value based upon a third value being in the selector field; and
    setting all of the bits from the position B+1 to a final position to the first binary value based upon with a fourth value being in the selector field.

5. A method according to claim 4, wherein the coded operand field further includes a mode selector bit, and wherein the step of deriving the operand field from the coded operand field comprises the steps of:
    assigning the last bit position of the operand field to the N−1 bit position of the operand field based upon the mode selector bit being a first mode value; and assigning the last bit position of the operand field to the N/2−1 bit position of the operand field based upon the mode selector bit being a second mode value.

6. A data processing device for executing instructions including at least one instruction having a coded operand field which represents a constant value, the constant value having a greater number of bits than the coded operand field, the data processing device comprising:

a register for at least partially loading the instruction from a bus;

an expansion circuit, connected to the register, for deriving a corresponding operand field having the constant value from the coded operand field of the instruction, the corresponding operand field being derived using one of a plurality of boolean operations identified by a first field in the coded operand field; and a multiplexer for selectively directing an output of the expansion circuit for subsequent processing based upon the state of an address field in the instruction.

7. A data processing device according to claim 6, wherein:

the operand field includes N bits and the coded operand field includes a position field of $L=\log_2 N$ bits and a selector field; and the expansion circuit comprises a decoder having L input terminals for receiving the position field as input and N output terminals, and N combinatorial circuits, each having first, second and third input terminals, and first, second and third output terminals connected, respectively, to corresponding output terminals of a preceding combinatorial circuit and corresponding input terminals of a following combinatorial circuit.

8. A data processing device according to claim 7, wherein the data processing device is a microprocessor.

9. A data processing device according to claim 6, wherein the data processing device is a microprocessor.

10. The method of claim 1, wherein:

the step of deriving the operand field comprises the steps of selecting a boolean operation from a plurality of boolean operations and decoding the coding operand field using the selected boolean operation.

11. The method of claim 10, wherein:

the coded operand field includes a selector field and a bit position field; and the step of decoding includes the steps of determining a bit position in the operand field and, upon the selector field being a first value, setting the bit position in the operand field to a first binary value and the other bits in the operand field to a second binary value which is the complement of the first binary value.

12. The method of claim 11, wherein:

the value of the bit position field in the coded operand field identifies the bit position in the operand field.

13. The method of claim 10, wherein:

the coded operand field includes a selector field and a bit position field;

the operand field comprises a first bit string and a second bit string; and the step of decoding includes the steps of determining a bit position in the operand field and, upon the selector field being a first value, setting the bits in the first bit string of the operand field to a first binary value and the bits in the second bit string thereof to a second binary value which is the logical complement of the first binary value, the width of each of the first and second bit strings being based upon the determined bit position.

14. The method of claim 13, wherein:

the bit position in the operand field comprises the value of the bit position field in the coded operand field.

15. The data processing device according to claim 7, wherein:

the first, second and third input terminals of a first combinatorial circuit receiving as input, respectively, a first bit of the selector field, a first binary value and a second bit of the selector field.

16. The data processing device according to claim 7, wherein:

each combinatorial circuit further includes a fourth input terminal connected to a corresponding output terminal of the decoder, and a fourth output terminal for producing a corresponding bit of the operand field as output; and the first and third input terminals of each combinatorial circuit being connected, respectively, to the first and third output terminals thereof, the first and second input terminals being connected as inputs to an AND gate, the fourth input terminal and an output terminal of the AND gate being connected as input to an OR gate, an output terminal of the OR gate being connected to the second output terminal, the output terminal of the OR gate and the third input terminal being connected as input to an XOR gate, an output terminal of the XOR gate being connected to the fourth output terminal.

17. The data processing device according to claim 6, wherein:

the expansion circuit comprises:

a decoder circuit, connected to the register, for decoding a second field of the coded operand field into a plurality of output signals, each output signal corresponding to a distinct bit in the operand field; and a selector circuit, connected to the register, for performing one of the plurality of boolean operations on each output signal of the decoder circuit, the particular boolean operation being selected by the first field of the coded operand field, the output of the selector circuit being connected to the multiplexer.

18. The data processing device according to claim 17, wherein:

only a single output signal of the decoder circuit is asserted at a time; and the selector circuit selectively sets to a first binary value an output signal thereof corresponding to the output signal of the decoder circuit that is asserted and sets to a second binary value the output signals corresponding to the non-asserted output signals of the decoder circuit, the second binary value being the logical complement of the first binary value.

19. The data processing device according to claim 17, wherein:

only a single output signal of the decoder circuit is asserted at a time; and the selector circuit selectively sets to a first binary value the output signals of the selector circuit in a first bit string and sets to a second binary value the output signals of the selector circuit in a second bit string, the width of the first and second bit strings being based upon the asserted output signal of the decoder circuit.

20. The data processing device according to claim 6, wherein:

a second field in the coded operand field identifies a particular bit position in the operand field; and the expansion circuit selectively sets the identified bit position in the operand field to a first binary value and the remaining bits in the operand field to a second binary value that is the logical complement of the first binary value.

21. The data processing device according to claim 6, wherein:
- a second field in the coded operand field identifies a particular bit position in the operand field; and
- the expansion circuit selectively sets a first string of bits in the operand field to a first binary value and the remaining bits in the operand field to a second binary value that is the logical complement of the first binary value, the width of the first string of bits being based upon the identified bit position in the operand field.

22. The data processing device according to claim 6, wherein:
- a second field in the coded operand field identifies a particular bit position in the operand field and a first bit signal; and
- the expansion circuit selectively sets bits in a first string of bits in the operand field to a first binary value, bits in a second string of bits in the operand field to a second binary value that is the logical complement of the first binary value, and bits in a third string of bits in the operand field to a binary value corresponding to the first bit signal, the width of the first and second bit strings being based upon the identified bit position.

23. A processing device for executing a plurality of instructions, at least one instruction including an opcode field and a coded operand field, the coded operand field corresponding to a constant value having a greater number of bits than the coded operand field, the processing device comprising:
- an instruction register; and
- an expansion circuit operably connected to the instruction register, for decoding the coded operand field in the at least one instruction upon the at least one instruction being loaded into the instruction register, the expansion circuit including selector circuitry for selecting one of a plurality of decoding operations for use in decoding the coded operand field.

* * * * *